(12) United States Patent
Thiessen

(10) Patent No.: US 6,927,586 B2
(45) Date of Patent: Aug. 9, 2005

(54) TEMPERATURE COMPENSATED VERTICAL PIN PROBING DEVICE

(75) Inventor: William F. Thiessen, Newtown, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 38 days.

(21) Appl. No.: 10/411,737

(22) Filed: Apr. 11, 2003

(65) Prior Publication Data

US 2004/0051546 A1 Mar. 18, 2004

Related U.S. Application Data

(63) Continuation-in-part of application No. 09/953,599, filed on Sep. 17, 2001, now Pat. No. 6,566,898, which is a continuation-in-part of application No. 09/519,363, filed on Mar. 6, 2000, now Pat. No. 6,633,175.

(51) Int. Cl.⁷ .............................................. G01R 31/02
(52) U.S. Cl. ........................................ 324/754; 324/761
(58) Field of Search ................................ 324/754–762; 439/480–482, 824, 80, 82

(56) References Cited

U.S. PATENT DOCUMENTS

| | | | |
|---|---|---|---|
| 3,930,809 A | 1/1976 | Evans | 29/720 |
| 4,382,228 A | 5/1983 | Evans | 324/758 |
| 4,599,559 A | 7/1986 | Evans | 324/754 |
| 4,719,417 A | 1/1988 | Evans | 324/762 |
| 4,975,638 A | 12/1990 | Evans et al. | 324/754 |
| 5,323,105 A | 6/1994 | Davis, Jr. et al. | 324/761 |
| 5,355,079 A | 10/1994 | Evans et al. | 324/754 |
| 5,416,429 A | 5/1995 | McQuade et al. | 324/762 |
| 5,442,299 A | 8/1995 | Caggiano | 324/758 |
| 5,623,213 A | 4/1997 | Liu et al. | 324/754 |
| 5,670,889 A | 9/1997 | Okubo et al. | 324/760 |
| 5,691,651 A | 11/1997 | Ehlermann | 324/760 |
| 5,841,291 A | 11/1998 | Liu et al. | 324/755 |
| 5,854,558 A | 12/1998 | Motooka et al. | 324/754 |
| 5,952,843 A | 9/1999 | Vinh | 324/761 |
| 5,955,888 A | 9/1999 | Frederickson et al. | 324/761 |
| 5,959,461 A | 9/1999 | Brown et al. | 324/765 |
| 5,973,504 A | 10/1999 | Chong | 324/754 |
| 5,977,787 A | 11/1999 | Das et al. | 324/761 |
| 6,005,401 A | 12/1999 | Nakata et al. | 324/754 |
| 6,031,383 A | 2/2000 | Streib et al. | 324/754 |
| 6,124,723 A | 9/2000 | Costello | 324/762 |
| 6,160,412 A | 12/2000 | Martel et al. | 324/761 |
| 6,163,162 A | 12/2000 | Thiessen et al. | 324/761 |
| 6,255,602 B1 | 7/2001 | Evans et al. | 174/262 |
| 6,297,657 B1 | 10/2001 | Thiessen et al. | 324/761 |
| 6,661,244 B2 * | 12/2003 | McQuade et al. | 324/754 |

OTHER PUBLICATIONS

International Search Report (PCT/US 01/06437).

* cited by examiner

*Primary Examiner*—Vinh P. Nguyen
(74) *Attorney, Agent, or Firm*—Wiggin and Dana LLP; Anthony P. Gangemi; Gregory S. Rosenblatt

(57) ABSTRACT

An improved vertical pin probing device is constructed with a housing with spaced upper and lower spacers of a metal alloy, each having a thin sheet of silicon nitride ceramic material held in a window in the spacer of adhesive. The spacers may be composed of foils adhered to one another in a laminated structure. The sheets of silicon nitride have laser-drilled matching patterns of holes supporting probe pins and insulating the probe pins from the housing. The spacers and silicon nitride ceramic sheets have coefficients of thermal expansion closely matching that of the silicon chip being probed, so that the probing device compensates for temperature variations over a large range of probing temperatures.

2 Claims, 4 Drawing Sheets

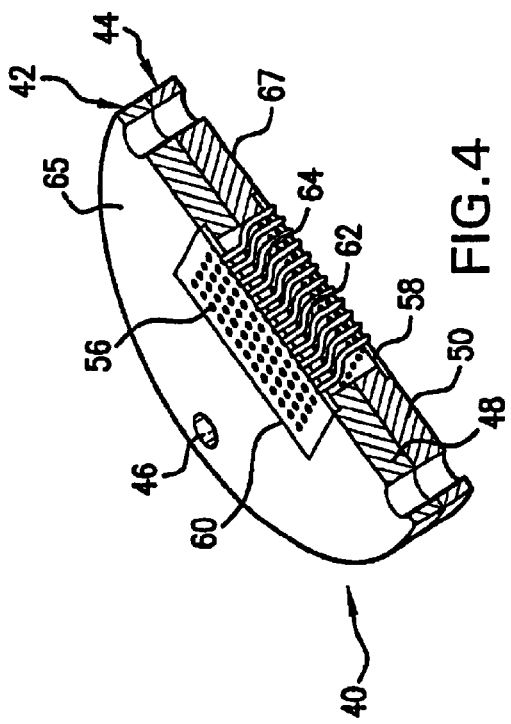
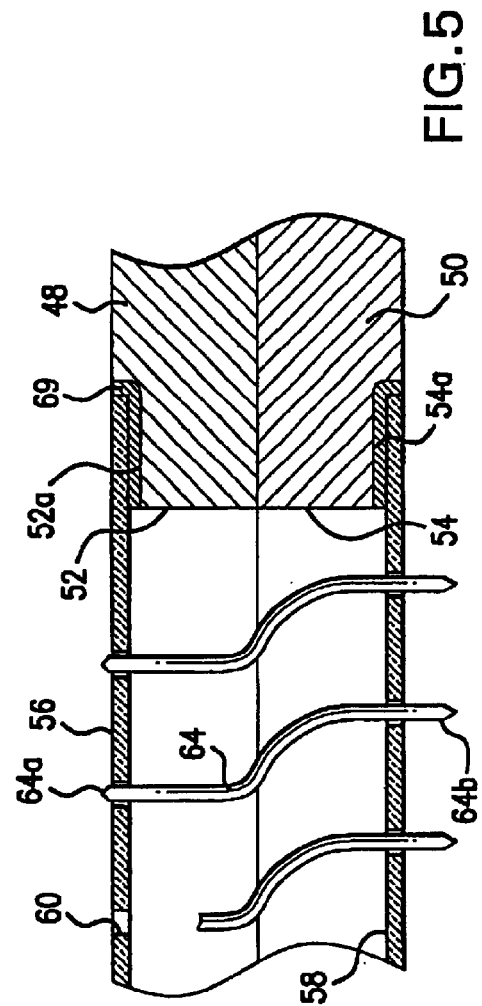
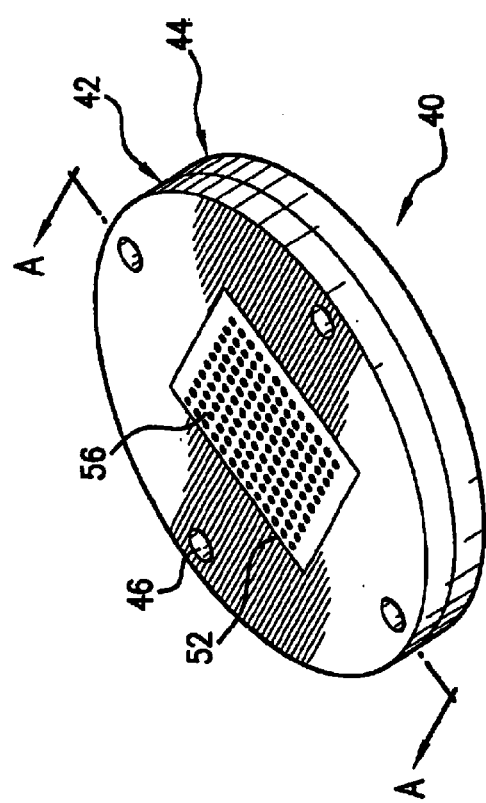

TEMPERATURE COMPENSATED VERTICAL PIN PROBING DEVICE

CROSS REFERENCE TO RELATED APPLICATIONS

This application is a continuation-in-part of U.S. application Ser. No. 09/953,599 filed Sep. 17, 2001, issued as Pat. No. 6,566,898, which is a continuation-in-part of U.S. application Ser. No. 09/519,363 filed Mar. 6, 2000, issued as U.S.Pat. No. 6,633,175.

BACKGROUND OF THE INVENTION

This invention relates to an improved temperature compensated vertical pin probing device for probing integrated circuits over a large temperature range.

Integrated circuits in their wafer state are tested using probing devices, the probes of which are traditionally of cantilevered or vertical configuration. In a known type of vertical pin probing device, the probes are held between spaced upper and lower dies and are generally curved with a straight portion that protrudes substantially perpendicular through the lower die of the housing. As the wafer under test is raised into contact with the probing device, and then overdriven a few thousandths of an inch, the probes recede into the housing, and the curved portion of the probe deflects causing spring force that provides good electrical contact with the integrated circuit pads.

Traditionally, the housing is made from a dielectric material, often a plastic sold under the trademark Delrin®, by E.I. duPont de Nemours & Co. of Wilmington, Del.

When a certain IC (integrated circuit) is tested at two or more temperatures, over a large temperature range, for example 32 degrees F., room temperature, and 275 degrees F., the typical prior art probe housing expands with a significantly higher thermal expansion rate than that of the silicon base material of the IC wafer under test. Such expansion causes a mismatch of the probe locations and the IC pad locations, a condition that not only results in failure to make satisfactory electrical contact, but may result in fatal damage to the IC due to probe penetration in the circuit region of the IC.

One solution to this problem is to dimensionally compensate the room temperature pitch dimensions of probes in the housing so that at the specified test temperature it will have expanded to provide a nearly exact match of probe and pad positions. Except for temperatures within a narrow range, this option requires separate probe devices for each specific temperature, thus greatly increasing the user's monetary investment in probe devices.

Another solution would be to find a plastic or other suitable dielectric that matches the coefficient of thermal expansion of the silicon wafer. To date, however, the most practical choices of dielectric materials have expansion rates much higher than silicon. Plastics generally have a limited high temperature capability, thereby preventing their uses for high temperature probing of IC's.

One suggestion for temperature compensation of a vertical pin probing device is disclosed in co-pending application Ser. No. 09/228,017 filed Jan. 11, 1999 in the names of W. Thiessen and A. Evans and assigned to the present assignee. That application suggested a probe comprising a pair of spacer members of a metal alloy sold under the trademark Invar® by E.I. duPont d Nemours & Co of Wilmington, Del., which has a coefficient of thermal expansion roughly equivalent to that of the silicon chip being probed. The spacer members had recesses supporting opposed channel shaped insulating inserts of a resin such as the one sold under the trademark Vespel® or a ceramic such as the one sold under the trademark Macor® by Corning Glass Works Corporation of Corning, N.Y. The ceramic sold under the trademark Macor® has a coefficient of thermal expansion significantly greater than that of the silicon chip, and required an anti-stick coating to provide the requisite lubricity to allow the probe pins to slide in the holes in the inserts. The assembly of the channel members in the recesses and subsequent drilling of the probe pin holes was a cumbersome process.

Another construction is disclosed in co pending application Ser. No. 09/228,016 filed Jan. 11, 1999 and also assigned to the present assignee. That application discloses a laminated structure of thin metal alloy foils, which may be formed a material sold under the trademark Invar®, used to support the probe pins in solid spacers, which may also be formed from the material sold under the trademark Invar® and have a coefficient of thermal expansion more closely matching that of the silicon. However, the foils are conductive and require an insulating coating to provide electrical insulation and lubricity.

It would be desirable to have a probe with all components more closely matching the coefficient of thermal expansion of the silicon chip, which is simple and easy to construct, does not require added coatings and which is suitable for high temperature probing and probing over a large temperature range.

Accordingly, one object of the present invention is to provide a temperature compensated vertical pin probing device for probing integrated circuits over a large temperature range.

Another object of the invention is to provide a vertical pin probing device which does not require application of special coatings to insulate or provide lubricity.

Another object of the invention is to provide an improved vertical pin probing device suitable for probing integrated circuits at very high temperatures, which is simple to construct.

SUMMARY OF THE INVENTION

Briefly stated, the invention comprises an improved temperature compensated vertical pin probing device for probing integrated circuits over a large temperature range, the integrated circuits having spaced contact pads on a circuit substrate to be contacted by probe pins for testing, the probing device being of a known type comprising upper and lower dies with upper and lower patterns of holes therethrough corresponding to the integrated circuit contact pad spacing at a preselected temperature, and a plurality of probe pins, each pin being disposed in a pair of upper and lower holes and extending beyond the lower die to terminate in a probe tip, the improvement comprising a die member comprising a spacer member with a coefficient of thermal expansion substantially matching that of the circuit substrate, said spacer member defining an aperture, a thin sheet of ceramic material covering said aperture with a coefficient of thermal expansion substantially matching that of the substrate, an adhesive securing the sheet of ceramic material over the aperture, the ceramic sheet defining a plurality of holes therethrough forming one of said upper and lower patterns of holes. Preferably the ceramic material is silicon nitride. The spacer member is preferably formed from a material sold under the trademark Invar®, either formed of a solid-piece or a laminated structure of foils.

DRAWING

The subject matter, which is regarded as the invention, is particularly pointed out and distinctly claimed in the concluding portion of the specification. The invention, however, both as to organization and method of practice, together with further objects and advantages thereof, may best be understood by reference to the following description, taken in connection with the accompanying drawings, in which:

FIG. 1 is an elevational drawing in cross section showing a prior art vertical pin probing device, together with portions of a printed circuit test board and wired interface and portions of a silicon wafer and chuck support, FIG. 2 is an enlarged side elevational view in cross section showing details of the FIG. 1 prior art vertical pin probing device construction for two probe pins, FIG. 3 is a perspective view of the improved vertical pin probing device according to the present invention, using solid spacers, FIG. 4 is a perspective view showing a cross section through the probing device, taken along lines A—A of FIG. 3, and FIG. 5 is an enlarged and exploded side elevational view in cross section illustrating portions of the probing device of FIGS. 3 and 4.

DETAILED DESCRIPTION OF THE DRAWINGS

Figure 1:
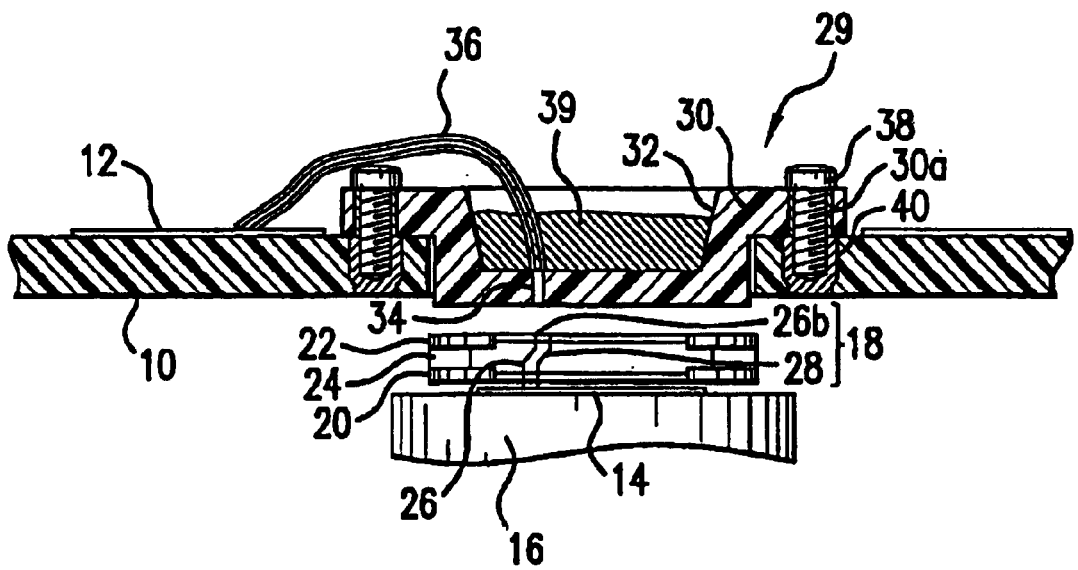
Figure 2:
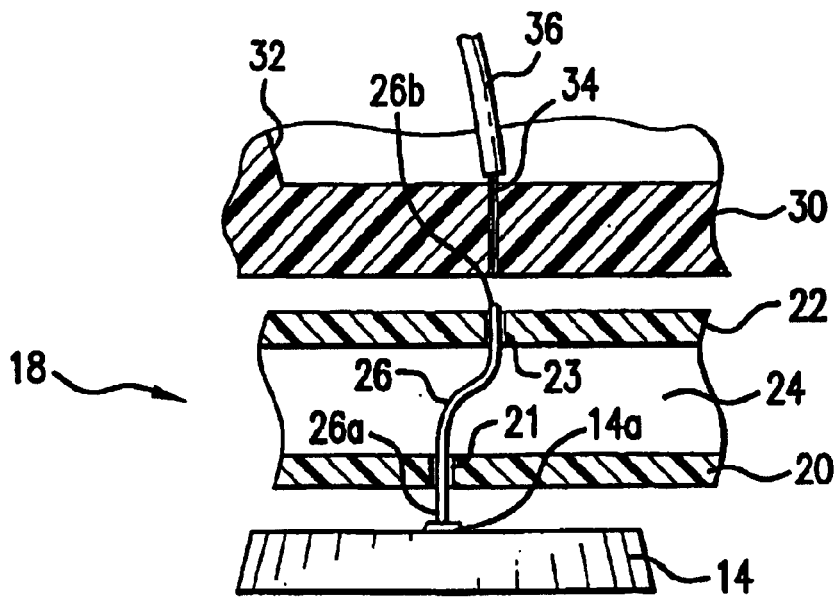

Before describing the improvements of the present invention, reference should be made to FIGS. 1 and 2 of the drawing illustrating a prior art vertical pin probing device used with an interconnecting device called a "space transformer" and a printed circuit board. The simplified view of FIG. 1 illustrates a prior art construction. A printed circuit test board 10 sometimes called a "probe card" includes conductive traces 12 which are connected in test circuit relationship to integrated circuit test equipment (not shown). In practice, the traces 12 lead to "pogo pads" on the printed circuit board, to which the external test equipment leads are connected in a prescribed test. An integrated circuit 14 or other device under test is supported on a movable chuck 16. Integrated circuit 14 typically has a pattern or matrix of contact pads to be simultaneously probed by a vertical-pin integrated circuit probing device 18, sold under the trademark COBRA®, which is sold by—Wentworth Laboratories, Inc. of Brookfield, Conn. Probing device 18 includes a lower die 20 with a group of holes 21 and upper die 22 with a group of holes 23 separated by a spacer 24 and carrying multiple vertical pin probes 26, 28. The die materials are typically made of a plastic insulating material such as the plastic including an acety resin that is sold under the trademark Delrin®, by E.I. duPont de Nemours & Co. of Wilmington, Del.

Reference to the enlarged cross-section view FIG. 2 illustrates that the two representative probes 26, 28 include probe tips 26a, 28a respectively protruding from holes 21 in the lower face of lower die 20 and exposed heads 26b, 28b respectively protruding from holes 23 in the upper side of upper die 22. The holes 21, 23 containing the opposite ends of the vertical probe pins 26, 28 are slightly offset from one another and the probe pins are curved in a snake-like configuration to promote buckling, so as to create substantially uniform contact pressure on the integrated circuit pads 14a, 14b despite any slight vertical unevenness or misalignment.

A prior art space transformer shown in FIG. 1 is indicated generally at 29 and comprises a mounting block 30 with a well 32 formed therein. At the bottom of the well, a number of holes 34 are laid out to dimensionally correspond to a first small inner pattern defined by the exposed heads 26b of the probe head assembly 18. The probing assembly 18 is shown separated from the space transformer 29 for clarity but is connected thereto in actual operation by screws (not shown).

An individual insulated wire 36 is connected to PCB trace 12 at one end and on the other end, the wire extends into a hole 34 in the mounting block 30 so as to be in electrical contact with probe head 26b on the underside of block 30 when the probe assembly 18 is bolted to the space transformer 29. A similar wire 37 cooperates with probe head 28b.

Space transformer 29 is attached to the PC board by means such as screws 38, and an epoxy potting compound 39 immobilizes wires 36, 37. The probing device 18 is attached to the underside of space transformer 29 by screws (not shown), so that probe heads 26b, 28b make electrical contact with leads 36, 37. The integrated circuit 14 has a number of spaced contact pads, such as 14a, 14b, spaced apart by dimension A. The probe tips 26a, 26b are spaced apart by dimension B. Prior art devices in which the coefficient of thermal expansion of the die material is substantially different from the coefficient of thermal expansion of the silicon wafer (0.00000156 inches per inch per degree F. or 0.0000028 meters per meter per degree Kelvin) will result in a mismatch between dimensions A and B to a degree which depends on the temperature range of probing.

Referring now to FIGS. 3, 4 and 5 of the drawing, the improved temperature compensated vertical pin probing device is indicated generally by reference numeral 40 and comprises an upper die member 42 and a lower die member 44. The dies are held together and mounted to the mounting block 30 shown in FIG. 1 by means of screws (not shown) passing through suitably placed holes 46 around the perimeter. Each of the upper and lower die members 68, 70 includes a spacer member 48, 50 respectively with a rectangular aperture 52, 54 respectively. Each aperture 52, 54 is covered by a thin ceramic sheet 56, 58 respectively. The spacer members 48, 50 are fabricated from a substrate core material having a coefficient of thermal expansion as close as possible to that of the silicon making up the circuit substrate. One preferred material is a nickel metal alloy, e.g., an alloy sold under the trademark Invare, having a coefficient of thermal expansion of 0.00000100 inches per inch per degree F. (or 0.0000018 meters per meter per degree Kelvin) at a nominal composition of 36% nickel, which is slightly less than that of silicon. The thermal coefficient of expansion may be varied so as to coincide exactly with that of silicon, if desired, by adjusting the percentage of nickel in the alloy as known in the art. (Sisco, Modem Metallurgy for Engineers, 2nd Edition p. 299).

As previously known in the art, probe pins 64 extend between the pattern of spaced and offset holes 60, 62 in the ceramic sheets 56, 58 supported by spacer members 48, 50 of upper and lower die members 42, 44 respectively. The upper ends of the probe pins 64 terminate in probe tips 64a which are disposed and make electrical contact with the wires such as 37 (FIG. 1) leading to the printed circuit test board. The lower ends of the probe pins 64 terminate in probe tips 64b which slide in holes 62 in known manner during probing of wafer 14 (FIG. 1).

Referring to the cross section of FIG. 4 taken along lines A—A of FIG. 3, it is seen that the periphery of the upper ceramic sheet 56 is mounted on the upper surface of spacer member 48 and the lower ceramic sheet 58 is mounted on the lower surface of spacer member 50, so that the two ceramic sheets are held apart in spaced relationship. The upper ceramic sheet 56 contains a plurality of holes 60 drilled by laser in a predetermined upper pattern of holes. The lower ceramic sheet 58 contains a plurality of holes 62 similarly drilled by laser in the same predetermined pattern, except that the pattern is offset from the upper pattern in the plane of the ceramic sheet to provide a lower pattern of holes. This provides upper and lower holes which are laterally offset from one another, in pairs.

Reference to the enlarged cross sectional drawing of FIG. 5, which is not to scale, illustrates a portion of the probe assembly 40. Aperture 52 in spacer 48 is enlarged about its periphery in the upper face to provide a ledge 52a, and a similar peripheral ledge 54a is provided in the lower face of spacer member 50. The upper ceramic sheet 56 is relatively thin (10 mils) and the lower ceramic sheet is also relatively thin, but thicker than the upper sheet, having a preferred dimension of about 20 mils in thickness. The ceramic sheets 56, 58 are mounted to cover the apertures 52, 54 on ledges 52a, 54a respectively by means of a high strength rigid adhesive such as epoxy.

In accordance with the present invention, we have discovered that silicon nitride ceramic is ideally suited for the ceramic sheets used in the improved vertical pin probing device. Silicon nitride ceramics offer high mechanical strength at elevated temperatures, thermal shock resistance and toughness as well as having a low coefficient of friction to enable sliding of the probe pins without the necessity of a coating of anti-stick material. The silicon nitride sheet is normally produced by hot pressing and is a two phase, alpha and beta, polycrystalline ceramic. It has a coefficient of thermal expansion of $1.7 \times 10^{-6}$ inches per inch per degree F. (or 0.0000034 meters per meter per degree Kelvin), which is only slightly greater than the coefficient of thermal expansion of silicon. Since the thermal coefficient of the spacer member is slightly less than that of silicon and the thermal coefficient of silicon nitride is slightly greater than that of silicon, the two materials used in the die member cooperate with one another to cause the overall thermal coefficient of the die member to closely approximate that of the silicon wafer.

Modification

Figure 7:
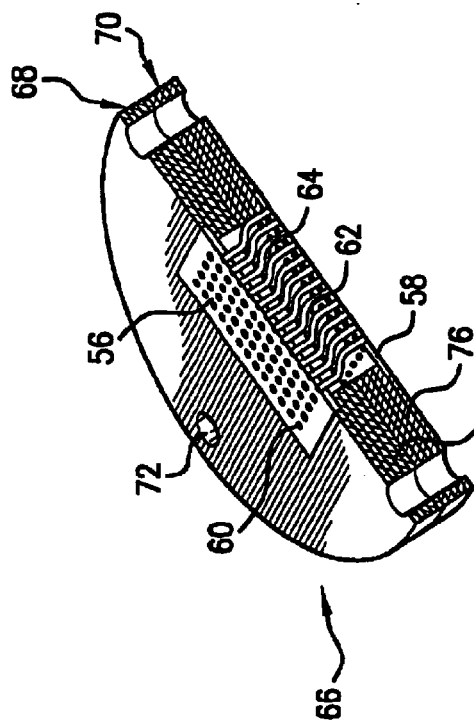
FIGS. 6–8 are views corresponding to FIGS. 3–5 respectively, but showing a modified construction of the vertical pin probing device using a laminated spacer construction.
Figure 6:
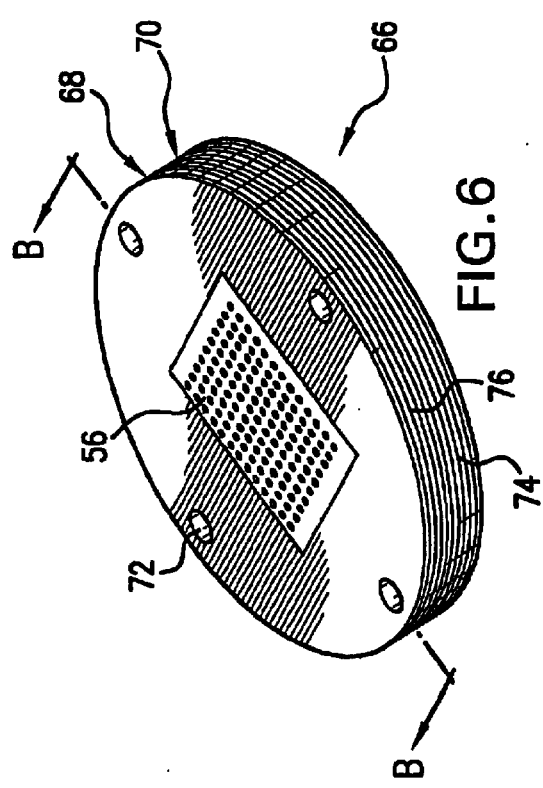
Figure 8:
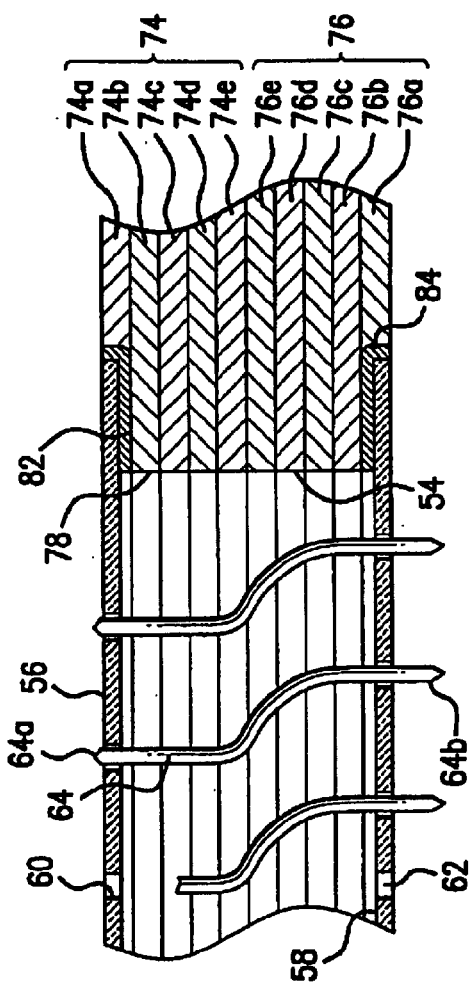

A modified form of the invention is seen in FIGS. 6, 7 and 8 which correspond to FIGS. 3, 4 and 5 respectively. Rather than using a spacer member formed from a solid metal alloy, e.g., such as the alloy sold under the trademark Invar®, it has been determined that a laminated spacer offers significant advantages in terms of ease of construction and improved performance over the solid spacers 48, 50 shown in FIGS. 3–5.

Referring to FIGS. 6–8 of the drawing, a modified temperature compensated vertical pin probing device is indicated generally by reference numeral 66 comprising an upper die member 68 and a lower die member 70. The dies are held together as previously described by screws (not shown) passing through suitably placed holes 72 around the perimeter. Upper and lower die members 68, 70 include an upper spacer member 74 and a lower spacer member 76, respectively provided with rectangular apertures 78, 80 respectively. Each aperture 78, 80 is covered by a thin ceramic sheet 56, 58 respectively, which may be the same as previously described in connection with FIGS. 3–5.

The spacer members 74, 76 are fabricated by chemically etching them from a foil formed from a metal alloy, e.g., the alloy sold under the trademark Invar®, and adhering the laminations together with an adhesive. Upper spacer 74 is composed of laminations 74a, 74b, 74c, 74d, 74e and lower spacer 76 is composed of laminations 76a, 76b, 76c, 76d, 76e. The laminations or foils are bonded together in a laminated structure. A suitable adhesive is an adhesive sold under the trademark 3M® structural adhesive #2290, which is sprayed on and bonds under heat and pressure. The support holes 72 may be etched at the same time as the central hole or aperture is etched in the lamination, which greatly facilitates the construction and avoids drilling holes through solid metal alloy as in the construction of FIGS. 3–5. A suitable thickness for foils used to make the laminated spacers 74 and 75 is 10 mils. This requires a stack of approximately 4 to 6 foils in a typical application to make a spacer.

As previously known in the art, probe pins 64 extend between the pattern of spaced and offset holes 60, 62 in the ceramic sheets 56, 58. The upper ends of the probe pins 64 terminate in probe pin tips 64a which are disposed and make electrical contact with the wires such as 37 (FIG. 1) leading to the printed circuit test board. The lower ends of the probe pins 64 terminate in probe tips 64b which slide in holes 62 in a known manner during probing of wafer 14 (FIG. 1).

Referring to cross section of FIG. 7, taken along lines B—B of FIG. 6, it is seen that upper ceramic sheet 56 is mounted on the upper side of spacer member 74 and the lower ceramic sheet 58 is mounted on the lower side of spacer member 76, so that the two ceramic sheets are held apart in spaced relationship. The upper and lower ceramic sheets 56, 58 are drilled to provide upper and lower patterns of holes 60, 62 respectively. The patterns are identical except that the upper pattern is offset from the lower pattern, as before.

Referring to the enlarged cross sectional drawing of FIG. 8 (which is not to scale) a portion of the probe assembly is illustrated. The top lamination 74a is etched to provide a larger opening that the underlying laminations 74b, 74c, 74d, 74e, so as to provide a peripheral recess for receiving ceramic sheet 56. The bottom lamination 76a is etched with larger openings than 76b, 76c, 76d, 76e to provide a recess for ceramic sheet 58.

The etching process is an easier way to create peripheral ledges to retain the ceramic sheets than machining solid metal alloy block spacers as used in FIGS. 3–5. The ceramic sheets 56, 58 are held in the recesses by adhesive at 82, 84. A suitable adhesive is the adhesive sold under the trademark 3M® Structural Adhesive #2290 or a high strength rigid epoxy adhesive.

Figure 9:
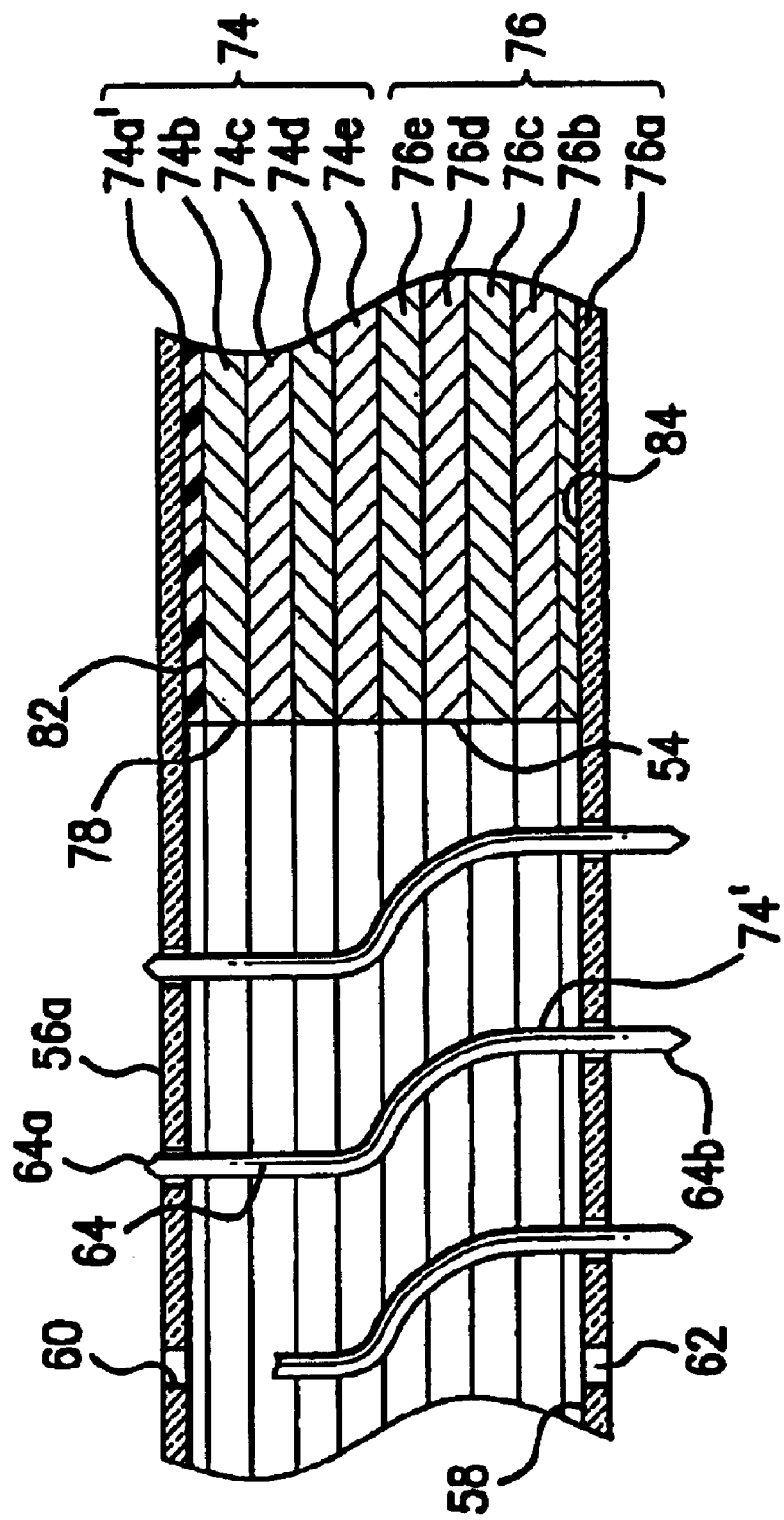
FIG. 9 is an enlarged cross-section of a portion of a probe assembly according to one embodiment of the present invention.

In another alternate embodiment, referring to the enlarged cross sectional drawing of FIG. 9 (which is not to scale) a portion of the probe assembly is illustrated. The upper die item 56a of a probing device 18, i.e., the probing device sold under the trademark COBRA® by Wentworth Laboratories, Inc. or Brookfield, Conn., can be a plastic film material containing a CTE value closely aligned to the CTE value of the space transformer (ST) (not shown). Since the probing device 18 of the present embodiment needs to include a pocket 74' formed by the housing (74b through 74e) or other suitable aperture to house the electrical contacts 64, the housing (74b through 74e) can be constructed from chemically etched metal laminates. The type metal to be selected for the housing can be based upon such factors as the chosen metal's CTE substantially the same as the CTE of the chosen plastic film material. Since it might not be possible to obtain a plastic film material with a CTE value substantially identical to the CTE value of one or more of the metal laminates, it is suggested that a compliant adhesive 74a' be used to mount the plastic film material 56a to the laminated metal housing. Use of a compliant adhesive would permit small differences in material growth while minimizing or avoiding the introduction of deformation or buckling of the thin plastic film layer. Selection of materials with the same relative CTE values can also permit better compliance to an assembly subjected to thermal gradients over large areas. The top lamination 74a' is a compliant adhesive applied to the underlying laminations 74b, 74c, 74d, 74e, so as to provide a recess for receiving electrical probes supported by the plastic sheet 56a.

With attempting to use Multi Layer Organic (MLO) packages as spacer transformers (ST) on printed circuit boards for probing semi-conductor devices on wafers at elevated temperatures, it is important to review the probe card assembly material choices for thermal compatibility. Whereas Silicon Nitride ($Si_3N_4$) might be a good choice of materials to interface with the heated wafer device under test (DUT), alternate materials may be used to interface with the ST. STs fabricated out of glass ceramic and organic materials have coefficient of thermal expansion (CTE) values in the range of 7 to $9 \times 10^{-6}$ inches per inch per degree Fahrenheit (commonly referenced as ppm/° F.). The reason for using such STs is that the STs are typically compatible with the general CTE value of FR4 (Flame Retardant 4) printed circuit board material employed in the probe card assembly.

As a proposed selection of material that can be used with a glass ceramic or Multi Layer Organic (MLO) ST, an upper die assembly can be constructed using a plastic film 56a, such as one sold under the trademark Cirlex® by E.I. duPont de Nemours & Co. of Wilmington, Del. (CTE=11.2 ppm/° F.), and distributed by Fralock, a Division of Lockwood Industries, Inc., a laminated metal housing fabricated from 303 Stainless Steel (CTE=9.6 ppm/° F.) or Aluminum Alloy 1100 (CTE=13.1 ppm/° F., items 74b thru 74e, and a two mil thick compliant transfer adhesive 8132LE manufactured by 3M Company, 74a'. Adhesiveless manufactured all-polyimide, laminate construction material sold under the trademark, Cirlex® by E.I., duPont de Nemours & Co. of Wilmington, Del., is available in sheets from 9 mil (225 $\mu$m) to 60 mil (1,500 $\mu$m). The adhesiveless manufactured all-polyimide laminate sheets provides an expanded range of thickness options, while offering excellent chemical, physical, thermal and electrical properties. The sheets are readily modified by laser cutting, drilling, machining and chemical etching.

Operation

The operation of the invention may be described as follows. Since the metal alloy material formed from an alloy sold under the trademark Invar® or similar has a coefficient of thermal expansion slightly lower than, but substantially matching, that of the silicon, the upper and lower dies expand substantially so as to dimensionally correspond to the expansion of the silicon wafer. Therefore the location of the centerlines of ceramic sheets 56, 58 and holes 60, 62 are located in accordance with the contact pads on the silicon wafer, and follow the expansion and contraction of the silicon wafer.

The ceramic sheets 56, 58 may expand and contract about their own centerlines with a slightly higher coefficient of thermal expansion than the silicon wafer and the spacer members 48, 50 (or 74, 76). However, the inserts are restrained by the adhesive and only permitted to expand in a direction perpendicular to the plane of the wafer. Therefore, despite the fact that the coefficient of thermal expansion of the insulated inserts may be slightly higher than that of the silicon wafer, it does not cause any significant mismatch between wafer contact pads and probe points over a large temperature range. The lubricity provided by the preferred ceramic material allows the probe pins to slide without requiring an anti-stick coating.

While there has been described what is considered to be the preferred embodiment of the invention and one modification thereof, other modifications will occur to those skilled in the art, and it is desired to secure in the appended claims all such modifications as fall within the true spirit and scope of the invention.

What is claimed is:

1. An improved temperature compensated vertical pin probing device for probing integrated circuits over a large temperature range, the integrated circuits having spaced contact pads on a circuit substrate to be contacted by probe pins for testing, the probing device including upper and lower spaced die members respectively defining upper and lower patterns of holes therethrough corresponding to the integrated circuit contact pad spacing at a preselected temperature, and a plurality of probe pins, each pin being disposed in a pair of upper and lower boles and extending beyond the lower die to terminate in a probe tip, said vertical pin probing device comprising;

a die member including a plastic film and a metal housing having first and second sides, the first side being adjacent to the plastic film and the second side being adjacent to the circuit substrate, and a thermally compliant adhesive joining the plastic film with the metal housing, the adhesive having a coefficient of thermal expansion substantially matching that of the metal housing;

wherein the compliant adhesive permits small differences in material growth while minimizing or avoiding the introduction of deformation or buckling of the plastic film; and wherein the plastic film and the metal housing have about the same relative CTE values for permitting compliance to an assembly subjected to thermal gradients over large areas.

2. The improvement according to claim 1, wherein said thermally compliant adhesive is about a 2 mil thick compliant transfer adhesive.

* * * * *